US012607937B2

(12) United States Patent
Lin et al.

(10) Patent No.: US 12,607,937 B2
(45) Date of Patent: Apr. 21, 2026

(54) PHOTORESIST TOP COATING MATERIAL FOR ETCHING RATE CONTROL

(71) Applicant: Taiwan Semiconductor Manufacturing Co., Ltd., Hsinchu (TW)

(72) Inventors: Tzu-Yang Lin, Hsinchu (TW); Ching-Yu Chang, Hsinchu (TW); Chin-Hsiang Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/447,673

(22) Filed: Aug. 10, 2023

(65) Prior Publication Data

US 2024/0192601 A1 Jun. 13, 2024

Related U.S. Application Data

(62) Division of application No. 17/231,946, filed on Apr. 15, 2021.

(51) Int. Cl.

| | |
|---|---|
| ***G03F 7/11*** | (2006.01) |
| ***G03F 7/09*** | (2006.01) |
| ***H01L 21/027*** | (2006.01) |

(52) U.S. Cl.
CPC ................ *G03F 7/11* (2013.01); *G03F 7/091* (2013.01); *G03F 7/094* (2013.01); *H01L 21/0276* (2013.01)

(58) Field of Classification Search
CPC . G03F 7/11; G03F 7/091; G03F 7/094; G03F 7/095; G03F 7/004; H01L 21/0276; H01L 21/0332
See application file for complete search history.

(56) References Cited

U.S. PATENT DOCUMENTS

| | | | |
|---|---|---|---|
| 4,927,738 | A | 5/1990 | Iwanaga et al. |
| 5,145,764 | A | 9/1992 | Bauer et al. |
| 5,965,328 | A | 10/1999 | Sano |
| 6,117,967 | A | 9/2000 | Fuller et al. |
| 6,737,222 | B2 | 5/2004 | Subramanian |
| 2005/0142855 | A1 | 6/2005 | Choi |
| 2006/0105272 | A1 | 5/2006 | Gallagher et al. |

(Continued)

OTHER PUBLICATIONS

Chang-Chung Yang and Wen-Chang Chen, "The structures and properties of hydrogen silsesquioxane (HSQ) films produced by thermal curing", J. Mater. Chem., 2002,12, 1138-1141 (Year: 2002).*

(Continued)

*Primary Examiner* — Jonathan Johnson
*Assistant Examiner* — Alexander N. Lee
(74) *Attorney, Agent, or Firm* — Seed IP Law Group

(57) ABSTRACT

A patterning stack is provided. The patterning stack includes a bottom anti-reflective coating (BARC) layer over a substrate, a photoresist layer having a first etching resistance over the BARC layer, and a top coating layer having a second etching resistance greater than the first etching resistance over the photoresist layer. The top coating layer includes a polymer having a polymer backbone including at least one functional unit of high etching resistance and one or more acid labile groups attacked to the polymer backbone or a silicon cage compound.

20 Claims, 11 Drawing Sheets

(56) References Cited

U.S. PATENT DOCUMENTS

| | | | | |
|---|---|---|---|---|
| 2006/0211254 | A1* | 9/2006 | Liu | H01L 21/76807 430/269 |
| 2007/0196773 | A1* | 8/2007 | Weigel | G03F 7/0752 430/311 |
| 2008/0026315 | A1* | 1/2008 | Huang | G03F 7/091 430/311 |
| 2008/0038927 | A1* | 2/2008 | Yamaguchi | H01L 21/31138 438/736 |
| 2009/0174036 | A1* | 7/2009 | Fuller | G03F 7/40 257/618 |
| 2010/0009132 | A1* | 1/2010 | Cheng | G03F 7/091 430/323 |
| 2010/0316950 | A1 | 12/2010 | Oguro et al. | |
| 2012/0122029 | A1* | 5/2012 | Kudo | G03F 7/091 430/325 |
| 2012/0308939 | A1* | 12/2012 | Kudo | C09D 5/006 430/326 |
| 2014/0363955 | A1 | 12/2014 | Hatakeyama et al. | |
| 2015/0234274 | A1* | 8/2015 | Hatakeyama | G03F 7/091 430/296 |
| 2015/0382473 | A1 | 12/2015 | Okamoto et al. | |
| 2016/0181100 | A1 | 6/2016 | deVilliers et al. | |
| 2017/0033218 | A1* | 2/2017 | Hung | H10D 30/797 |
| 2017/0092487 | A1 | 3/2017 | Kao | |
| 2018/0046077 | A1* | 2/2018 | Ishimaru | C07C 317/10 |
| 2019/0189428 | A1 | 6/2019 | De Silva | |

OTHER PUBLICATIONS

"A practical approach to reactive ion etching", Fouad Karouta 2014 J. Phys. D: Appl. Phys. 47 233501 (Year: 2014).*

* cited by examiner

PHOTORESIST TOP COATING MATERIAL FOR ETCHING RATE CONTROL

PRIORITY CLAIM AND CROSS-REFERENCE

This application is a divisional application of U.S. patent application Ser. No. 17/231,946, filed Apr. 15, 2021, the disclosure of which is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
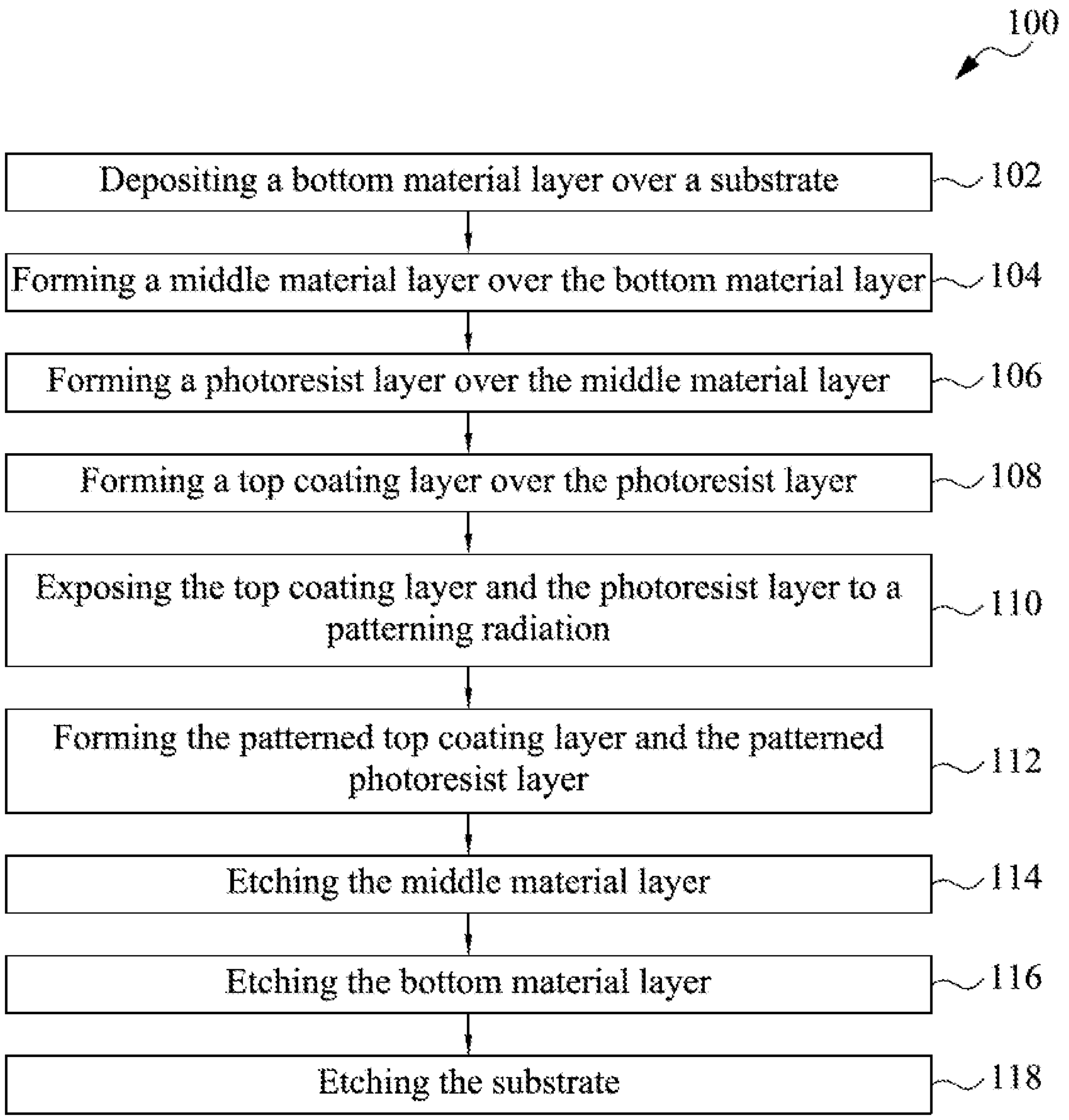
FIG. 1 is a flow chart of a method for fabricating a semiconductor structure, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. System may be otherwise oriented (rotated 90 degrees or at other orientations) and the spatially relative descriptors used herein may likewise be interpreted accordingly.

Photolithography has been used for patterning a substrate (e.g., a wafer) in order to form various features of an IC. A typical photolithography process includes coating a layer of photoresist (or resist) over the substrate, exposing the photoresist to a radiation such as extreme ultraviolet (EUV) ray, and developing and partially stripping the photoresist to leave a patterned photoresist over the substrate. The patterned photoresist is then used as an etch mask in subsequent etching processes, transferring the pattern in the photoresist to an underlying material layer. Generally, to act as an etch mask, the photoresist pattern must exhibit sufficient etching resistance in the subsequent etching processes to satisfy the etching request for the etching budget.

Semiconductor technologies are continually progressing to smaller feature sizes, for example down to feature sizes of 65 nanometers, 45 nanometers, and below. A photoresist pattern used to produce such small feature sizes typically has a high aspect ratio. Maintaining a desired critical dimension (CD) can be very difficult for various reasons. For example, the photoresist pattern may experience pattern collapse and CD degradation during the development and drying process. Surface tension of the wet developer and rinse chemicals can exert sufficient force to mechanically distort the photoresist pattern, especially when the aspect ratio is large. A thin photoresist layer is used to prevent pattern collapse at high aspect ratios. However, most photoresist materials erode significantly and fairly quickly relative to the underlying material layer to be etched. When using only the photoresist layer as an etch mask, a thin photoresist layer normally does not have the etching budget which allows for adequate etching time necessary to complete transfer of photoresist pattern into the underlying material layer.

In embodiments of the present disclosure, a top coating layer is formed over a photoresist layer and is used in combination with the photoresist layer as an etch mask to transfer a pattern into an underlying material layer. The top coating layer has a higher etching resistance than the photoresist layer, which allows for adequate etching time necessary to create patterned features in the underlying material layer. The top coating layer, thus, enables the use of a thin photoresist layer to prevent photoresist pattern collapse, while at the same time satisfying the required etching budget. This is very desirable for advanced process nodes, such as 65 nanometers (nm), 45 nm, 28 nm, or smaller, where photoresist patterns have become narrower due to smaller feature sizes to be realized.

FIG. 1 is a flowchart of a method 100 of fabricating a semiconductor structure, in accordance with some embodiments of the present disclosure. FIGS. 2A-2I are cross-sectional views of a semiconductor structure 200 fabricated according to one or more steps of the method 100 of FIG. 1. It is understood that additional steps can be provided before, during, and after the method 100, and some of the steps described below can be replaced or eliminated, for additional embodiments of the method. It is further understood that additional features can be added in the semiconductor structure 200, and some of the features described below can be replaced or eliminated, for additional embodiments of the semiconductor structure.

The semiconductor structure may be an intermediate structure fabricated during processing of an IC, or portion thereof, that may comprise static random access memory (SRAM) and/or other logic circuits, passive components such as resistors, capacitors, and inductors, and active components such as p-channel field effect transistors (PFETs), n-channel field effect transistors (NFETs), metal-oxide semiconductor field effect transistors (MOSFETs), complementary metal-oxide semiconductor (CMOS) transistors, bipolar transistors, high voltage transistors, high frequency transistors, other memory cells, and combinations thereof. The semiconductor structure 200 may include a plurality of semiconductor devices (e.g., transistors), which may be interconnected.

Figure 2A:
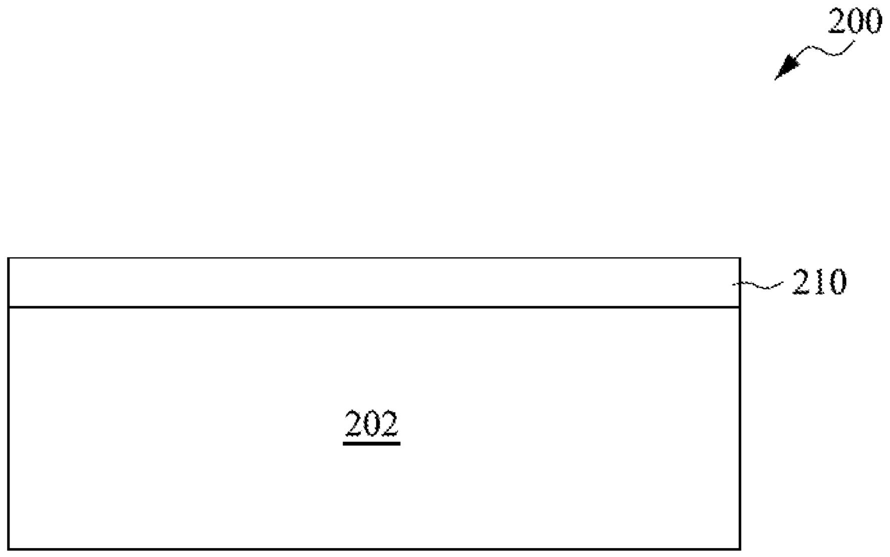
FIGS. 2A-2I are cross-sectional views of a semiconductor structure fabricated using the method of FIG. 1, in accordance with some embodiments.

Referring to FIGS. 1 and 2A, the method 100 includes operation 102, in which a bottom material layer 210 is deposited over a substrate 202, in accordance with some embodiments. FIG. 2A is a cross-sectional view of the semiconductor structure 200 after forming the bottom material layer 210 over the substrate 202, in accordance with some embodiments. The bottom material layer 210 can be a first layer in a patterning stack usable for patterning the substrate 202 or film layers over the substrate 202 via photolithography processes.

Referring to FIG. 2A, in some embodiments, the substrate 202 may be a bulk semiconductor substrate including one or more semiconductor materials. In some embodiments, the substrate 202 may include silicon, silicon germanium, carbon doped silicon (Si:C), silicon germanium carbide, or other suitable semiconductor materials. In some embodiments, the substrate 202 is composed entirely of silicon.

In some embodiments, the substrate 202 may include one or more epitaxial layers formed on a top surface of a bulk semiconductor substrate. In some embodiments, the one or more epitaxial layers introduce strains in the substrate 202 for performance enhancement. For example, the epitaxial layer includes a semiconductor material different from that of the bulk semiconductor substrate, such as a layer of silicon germanium overlying bulk silicon or a layer of silicon overlying bulk silicon geranium. In some embodiments, the epitaxial layer(s) incorporated in the substrate 202 are formed by selective epitaxial growth, such as, for example, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), or combinations thereof.

In some embodiments, the substrate 202 may be a semiconductor-on-insulator (SOI) substrate. In some embodiments, the SOI substrate includes a semiconductor layer, such as a silicon layer formed on an insulator layer. In some embodiments, the insulator layer is a buried oxide (BOX) layer including silicon oxide or silicon germanium oxide. The insulator layer is provided on a handle substrate such as, for example, a silicon substrate. In some embodiments, the SOI substrate is formed using separation by implanted oxygen (SIMOX) or other suitable technique, such as wafer bonding and grinding.

In some embodiments, the substrate 202 may also include a dielectric substrate such as silicon oxide, silicon nitride, silicon oxynitride, a low-k dielectric, silicon carbide, and/or other suitable layers.

In some embodiments, the substrate 202 may also include various p-type doped regions and/or n-type doped regions, implemented by a process such as ion implantation and/or diffusion. Those doped regions include n-well, p-well, lightly doped region (LDD) and various channel doping profiles configured to form various IC devices, such as a complimentary metal-oxide-semiconductor field-effect transistor (CMOSFET), imaging sensor, and/or light emitting diode (LED). The substrate 202 may further include other functional features such as a resistor and/or a capacitor formed in and/or on the substrate 202.

In some embodiments, the substrate 202 may also include various isolation features. The isolation features separate various device regions in the substrate 202. The isolation features include different structures formed by using different processing technologies. For example, the isolation features may include shallow trench isolation (STI) features. The formation of an STI may include etching a trench in the substrate 202 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

In some embodiments, the substrate 202 may also include gate stacks formed by dielectric layers and electrode layers. The dielectric layers may include an interfacial layer and a high-k dielectric layer deposited by suitable techniques, such as chemical vapor deposition (CVD), atomic layer deposition (ALD), physical vapor deposition (PVD), thermal oxidation, combinations thereof, and/or other suitable techniques. The interfacial layer may include silicon dioxide and the high-k dielectric layer may include LaO, AlO, ZrO, TiO, $Ta_2O_5$, $Y_2O_3$, $SrTiO_3$, $BaTiO_3$, BaZrO, HfZrO, HfLaO, HfSiO, LaSiO, AlSiO, HfTaO, HfTiO, $(Ba,Sr)TiO_3$ (BST), $Al_2O_3$, $Si_3N_4$, SiON, and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The electrode layer may include Ti, Ag, Al, TiAlN, TaC, TaCN, TaSiN, Mn, Zr, TiN, TaN, Ru, Mo, Al, WN, Cu, W, any suitable materials, and/or a combination thereof.

In some embodiments, the substrate 202 may also include a plurality of inter-level dielectric (ILD) layers and conductive features integrated to form an interconnect structure configured to couple the various p-type and n-type doped regions and the other functional features (such as gate electrodes), resulting in a functional integrated circuit. In one example, the substrate 202 may include a portion of the interconnect structure and the interconnect structure may include a multi-layer interconnect (MLI) structure and an ILD layer integrated with a MLI structure, providing an electrical routing to couple various devices in the substrate 202 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The bottom material layer 210 is disposed over the substrate 202. The bottom material layer 210 functions as a mask to protect the substrate 202 from etching or ion implantation. In some embodiments, the bottom material layer 210 also functions as a planarization layer to provide a planar surface upon which a middle material layer 220 (FIG. 2B) is formed. In some embodiments, the bottom material layer 210 includes an organic polymer free of silicon. For example, the bottom material layer 210 may include spin-on carbon, diamond-like carbon, polyarylene ether, or polyimide. In some embodiments, the bottom material layer 210 is formed by spin coating, spray coating, dip coating, or other suitable deposition processes. The bottom material layer 210 is formed to have a thickness sufficient to provide a planar surface and etching resistance. In some embodiments, the bottom material layer 210 may have a thickness ranging from about 50 nm to about 300 nm. If the thickness of the bottom material layer 210 is too small, the bottom material layer 210 is not able to provide a planar surface and sufficient etching resistance, in some instances. On the other hand, if the thickness of the bottom material layer 210 is too great, production costs are increased as a result of unnecessary consumption of material and increased processing time to pattern the bottom material layer 210, in some instances.

Figure 2B:
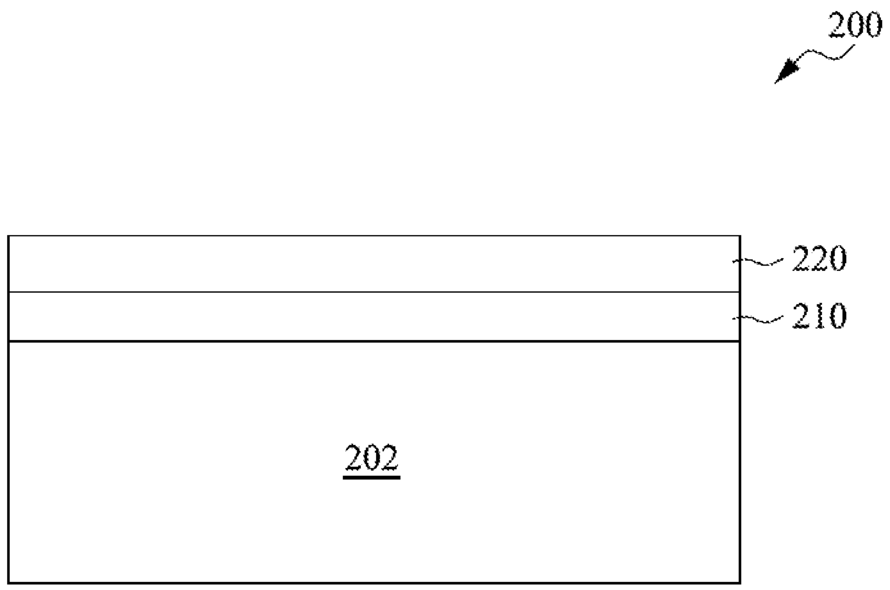

Referring to FIGS. 1 and 2B, the method 100 proceeds to operation 104, in which a middle material layer 220 is formed over the bottom material layer 210, in accordance with some embodiments. FIG. 2B is a cross-sectional view of the semiconductor structure 200 of FIG. 2A after forming the middle material layer 220 over the bottom material layer 210, in accordance with some embodiments. The middle material layer 220 can be a second layer in a patterning stack.

Referring to FIG. 2B, the middle material layer 220 is disposed over the bottom material layer 210. The middle material layer 220 includes a material that provides etching selectivity from the bottom material layer 210. The middle material layer 220 thus functions as a hard mask to transfer a pattern to the bottom material layer 210. In some embodiments, the middle material layer 220 also functions as a bottom anti-reflective coating (BARC) that reduces reflection during a lithography exposure process subsequently performed, thereby increasing the imaging contrast and enhancing the imaging resolution.

In some embodiments, the middle material layer 220 is a nitrogen-free anti-reflective coating (NFARC) layer including material(s) such as silicon oxide or silicon oxygen carbide. In some embodiments, middle material layer 220 is formed by a deposition process such as, for example, CVD or plasma enhanced chemical vapor deposition (PECVD).

Figure 3:
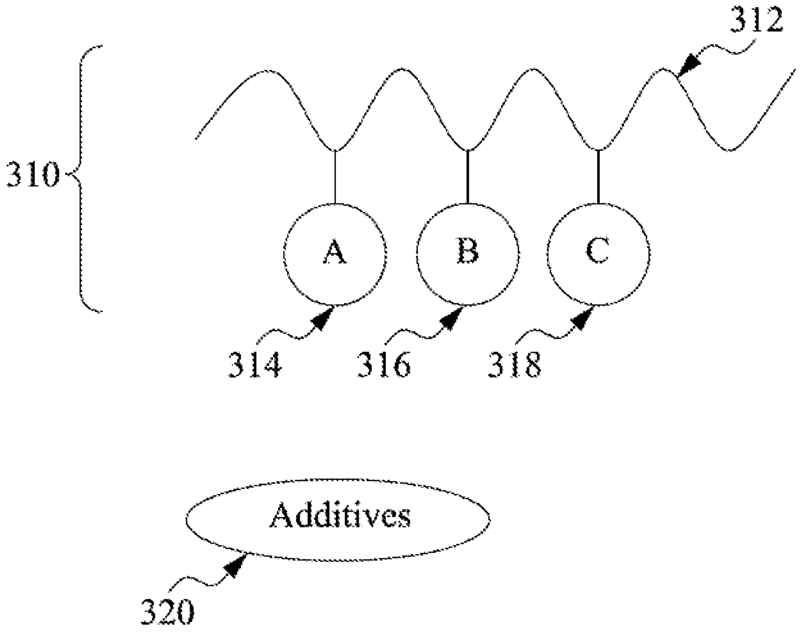
FIG. 3 illustrates a composition that may be used in the middle material layer, in accordance with some embodiments.

In some other embodiments and as shown in FIG. 3, the middle material layer 220 may include a polymer 310 and one or more additives 320. The polymer 310 may be an organic polymer or an inorganic polymer. In some embodiments, the polymer 310 has a molecular weight from about 1,000 to 20,000. In some embodiments, the polymer 310 includes a polymer backbone 312 and a plurality of pendant groups chemically bonded to the polymer backbone. In some embodiments, the polymer backbone 312 may include polystyrene (PS), poly(hydroxystyrene) (PHS), poly(methyl methacrylate) (PMMA), a polyether, a polyimide, a polyurethane, a siloxane polymer, or a copolymer thereof. In some embodiments, the pedant groups include first pedant groups 314 (labeled as "A") that provide crosslinking sites, second pendant groups 316 (labeled as "B") containing chromophores that modify the characteristics (such as refractive index n, extinction coefficient K and/or etching resistance) of the middle material layer 220, and third pendant groups 318 (labeled as "C") that enhance the adhesion of a photoresist layer subsequently formed and tune other effects, such as etching performance and wet strippability.

In some embodiments, the first pedant groups (A) 314 include cross-linking agents which function to cross-link various components in the middle material layer 220 into a polymer network. In some embodiments, the cross-linking agent comprises amine, aziridine, hydroxyl, aliphatic epoxy, cycloaliphatic epoxy, oxetane, or maleic anhydride.

In some embodiments, the second pendant groups (B) 316 include light-sensitive functional groups, such as aromatic groups or heterocyclic groups, capable of absorbing the impinging light and preventing the light from being reflected. Exemplary aromatic groups include, but are not limited to, substituted and unsubstituted phenyl, substituted and unsubstituted napthlenyl, substituted and unsubstituted phenanthrenyl, substituted and unsubstituted anthracenyl, substituted and unsubstituted phenalenyl, and other aromatic derivatives containing three or more rings. Exemplary heterocyclic groups include, but are not limited to, substituted and unsubstituted acridine, substituted and unsubstituted pyrrolidinyl, substituted and unsubstituted pyranyl, substituted and unsubstituted piperidinyl, and substituted and unsubstituted quinolinyl.

In some embodiments, the third pendant groups (C) 318 include polar groups for enhancing adhesion of the middle material layer 220 with an underlying layer such as the bottom material layer 210. In some embodiments, the polar group may be hydroxyl adamantane, norbornane lactone, γ-butyrolactone, and derivatives thereof.

In some embodiments, the middle material layer 220 may further include one or more additives 320 adapted to modify the characteristics and enhance of the performance (such as wettability and accordingly enhancement of the cleaning mechanism during the cleaning process) of the middle material layer 220. For example, in some embodiments, the middle material layer 220 may include a surfactant in order to help improve the ability of the middle material layer 220 to coat the surface on which it is applied. In some embodiments, the surfactant may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Examples of surfactants that can be used in the present disclosure include, but are not limited to, polyoxyethylene lauryl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol, polypropylene glycol, polyoxyethylene stearyl ether and polyoxyethylene cetyl ether; fluorine containing cationic surfactants, fluorine containing nonionic surfactants, fluorine containing anionic surfactants, cationic surfactants and anionic surfactants, combinations of these, or the like.

Another additive that may be added to the middle material layer 220 is a quencher, which may be utilized to inhibit diffusion of the generated acids/bases/free radicals within the middle material layer 220, and thereby helps to improve the stability of the middle material layer 220 over time. In some embodiments, the quencher is an amine such as a second lower aliphatic amine, a tertiary lower aliphatic amine, or the like. Examples of amines that can be used in the present disclosure include, but are not limited to, trimethylamine, diethylamine, triethylamine, di-n-propylamine, tri-n-propylamine, tripentylamine, diethanolamine, and triethanolamine, alkanolamine, combinations of these, or the like.

Alternatively, an organic acid may be utilized as the quencher. Examples of organic acids that can be used in the present disclosure include, but are not limited to, malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, including phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Figure 2C:
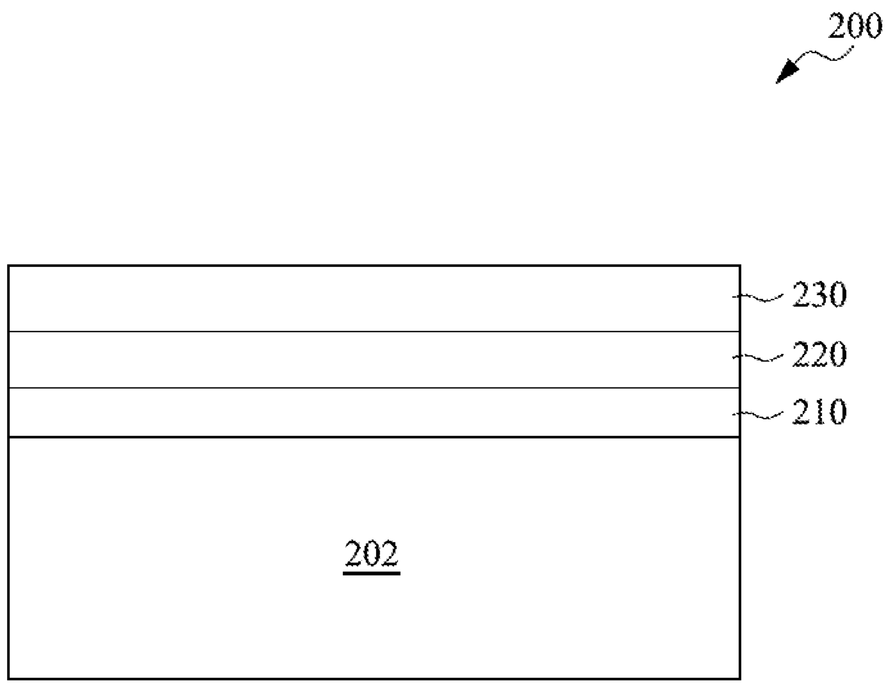

Referring to FIGS. 1 and 2C, the method 100 proceeds to operation 106, in which a photoresist layer 230 is formed over the middle material layer 220, in accordance with some embodiments. FIG. 2C is a cross-sectional view of the semiconductor structure 200 of FIG. 2B after forming the photoresist layer 230 over the middle material layer 220, in accordance with some embodiments. The photoresist layer 230 can be a third layer in a patterning stack.

The photoresist layer 230 is disposed over the middle material layer 220. In some embodiments, the photoresist layer 230 includes a positive tone resist that can be developed using a negative tone developer in that unexposed portions of the positive tone photoresist are removed during the development process. In some other embodiments, the photoresist layer 230 includes a negative tone resist that can be developed using a positive tone developer in that exposed portions of the negative tone photoresist are removed during the development process. In some embodiments, the photoresist layer 230 includes a polymer and one or more photoactive compounds (PACs). In some embodiments, the photoresist layer 230 includes a carbon backbone polymer such as, for example, polyhydroxystyrene, polymethylmethacrylate, poly(t-butyl)methacrylate, polyvinyl alcohol, polyvinylphenol, polynorbonene, poly(p-formyl)oxystyrene, poly(t-butoxycarbonyloxystyrene), polyvinylpyrrolidone, polymethylisoprenylketone, phenolformaldehyde polymers, melamine-formaldehyde polymers, and copolymers, blends and derivatives of. In some embodiments, the photoresist layer 230 includes t-Butyloxycarbonyl (t-BOC) resist or acetal resist. For advanced semiconductor patterning using an EUV radiation, the photoresist layer 230 may utilize a chemical amplification (CA) resist material. For example, a positive CA resist material includes a polymer that turns soluble to a developer such as a base solution after the polymer is reacted with acid. Alternatively, the CA resist material can be negative and include a polymer that turns insoluble to a developer such as a base solution after the polymer is reacted with acid. In furtherance of the embodiments when the CA resist material is used, the PACs may include a photo acid generator (PAG) distributed in the photoresist layer 230. When absorbing photo energy, the PAG decomposes and forms a small amount of acid. Examples of suitable PAGs that can be used in the present disclosure include, but are not limited to, salts of sulfonium cations with sulfonates, salts of iodonium cations with sulfonates, sulfonyldiazomethane compounds, N-sulfonyloxyimide PAGs, benzoinsulfonate PAGs, pyrogallol trisulfonate PAGs, nitrobenzyl sulfonate PAGs, sulfone PAGs, glyoxime derivatives, triphenylsulfonium nonaflate, and/or other suitable PAGs. The PAGs may have a concentration ranging from about 1% and 30% by weight of the photoresist layer 230.

In some embodiments, a cross-linking agent may also be added to the photoresist layer 230. The cross-linking agent reacts with the polymer within the photoresist layer 230 after exposure, assisting in the increase of the cross-linking density of the photoresist layer 230, which helps to improve the resistance of the photoresist layer to dry etching.

In some embodiments, in addition to the polymers, the PACs, and the cross-linking agents, the photoresist layer 230 may also include a number of other additives that will assist the photoresist layer 230 to obtain the high resolution. In some embodiments, the additives may include surfactants, quenchers, stabilizers, dissolution inhibitors, plasticizers, coloring agents, adhesion additives, surface leveling agents, combinations thereof, or the like.

The surfactants may be added in order to help improving the ability of the photoresist layer 230 to coat the surface on which it is applied (e.g., the middle material layer 220). The photoresist layer 230 may include a surfactant the same as, or different from, the surfactant used in the middle material layer 220.

The quenchers may be added to inhibit diffusion of the generated acids/bases/free radicals within the photoresist layer 230, which helps the resist pattern configuration and improves the stability of the photoresist layer 230 over time. The photoresist layer 230 may include a quencher the same as, or different from, the quencher used in the middle material layer 220.

The stabilizers may be added to assist in preventing undesired diffusion of the acids generated during exposure of the photoresist layer 230. In some embodiments, the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used as the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

The dissolution inhibitors may be added in order to help control dissolution of the photoresist layer 230 during development. In some embodiments, bile-salt esters may be utilized as the dissolution inhibitor. Specific examples of dissolution inhibitors that can be used in the present disclosure include, but are not limited to, cholic acid (IV), deoxycholic acid (V), lithocholic acid (VI), t-butyl deoxycholate (VII), t-butyl lithocholate (VIII), and t-butyl-3-α-acetyl lithocholate (IX).

The plasticizers may be added to reduce delamination and cracking between the photoresist layer 230 and underlying layers (e.g., the middle material layer 220). Specific examples of plasticizers that can be used in the present disclosure include, but are not limited to, oligo- and polyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

The coloring agents may be added to help observers examine the photoresist layer 230 and find any defects that may need to be remedied prior to further processing. In some embodiments, the coloring agent may be either a triarylmethane dye or, alternatively, may be a fine particle organic pigment. Specific examples of coloring agents that can be used in the present disclosure include, but are not limited to, crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, phthalocyanine blue, phthalocyanine green, iodine green, Victoria blue, naphthalene black, photopia methyl violet, bromphenol blue and bromcresol green, laser dyes such as rhodamine 6G, coumarin 500, 4-(dicyanomethylene)-2-methyl-6-(4-dimethylaminostyryl)-4H pyran) (DCM), kiton red 620, pyrromethene 580, or the like. Additionally, one or more coloring agents may be used in combination to provide the desired coloring.

The adhesion additives may be added in order to promote adhesion between the photoresist layer 230 and an underlying layer upon which the photoresist layer 230 has been applied (e.g., the middle material layer 220). In some embodiments, the adhesion additives include a silane compound with at least one reactive substituent such as a carboxyl group, a methacryloyl group, an isocyanate group and/or an epoxy group. Specific examples of the adhesion components that can be used in the present disclosure include, but are not limited to, trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, 8-oxyquinoline, 4-hydroxypteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

The surface leveling agents may be added in order to assist a top surface of the photoresist layer 230 to be level so that impinging light will not be adversely modified by an un-level surface. In some embodiments, the surface leveling agents may include fluoroaliphatic esters, hydroxyl terminated fluorinated polyethers, fluorinated ethylene glycol polymers, silicones, acrylic polymer leveling agents, combinations of these, or the like.

In some embodiments, the photoresist layer 230 may be formed by spin coating. For example, a photoresist solution is first formed by dissolving the individual components of the photoresist layer 230, such as the polymer and the PACs, along with the one or more additives or other agents, in a suitable solvent. The solvent of the photoresist layer 230 is selected such that the solvent is not capable of dissolving the middle material layer 220. Exemplary solvents that can be used in the preset disclosure include, but are not limited to, a ketone-based solvent, ester-based solvent, alcohol-based solvent, amide-based solvent, ether-based solvent, and hydrocarbon-based solvent. In some embodiments, the solvent used to prepare the photoresist solution includes toluene, 1,4-dioxane, tetrahydrofuran, anisole, n-butyl acetate, methyl n-amyl ketone, 4-methyl-2-pentanol, propylene glycol methyl ether acetate, propylene glycol methyl ether, gamma-butyrolactone, ethyl lactate, cyclohexanone, ethyl ketone, dimethyl formamide, alcohol (e.g., ethanol and methanol), and combinations thereof.

Subsequently, the photoresist solution is applied to a top surface of the middle material layer 220 by spin coating that distributes the photoresist in the form of an even layer (i.e., photoresist layer 230) over the middle material layer 220. In some embodiments, the photoresist layer 230 has a thickness ranging from 50 nm to 80 nm.

In some embodiments, after deposition a soft bake process is performed on the photoresist layer 230 to drive off the solvent, while leaving behind the polymer, the PACs, the cross-linking agents, and the other additives. In some embodiments, the soft bake process is performed at a temperature suitable to evaporate the solvent in the photoresist layer 230, such as between about 100° C. and 200° C., although the precise temperature depends upon the materials chosen for the photoresist layer 230. For example, in some embodiments, the photoresist layer 230 is heated to about 150° C. The soft bake process is performed for a time sufficient to cure and dry the photoresist layer 230. In some embodiments, the soft bake process is performed for a time period from about 10 seconds to about 10 minutes. For example, in some embodiments, the photoresist layer 230 is cured for about 300 seconds.

Figure 2D:
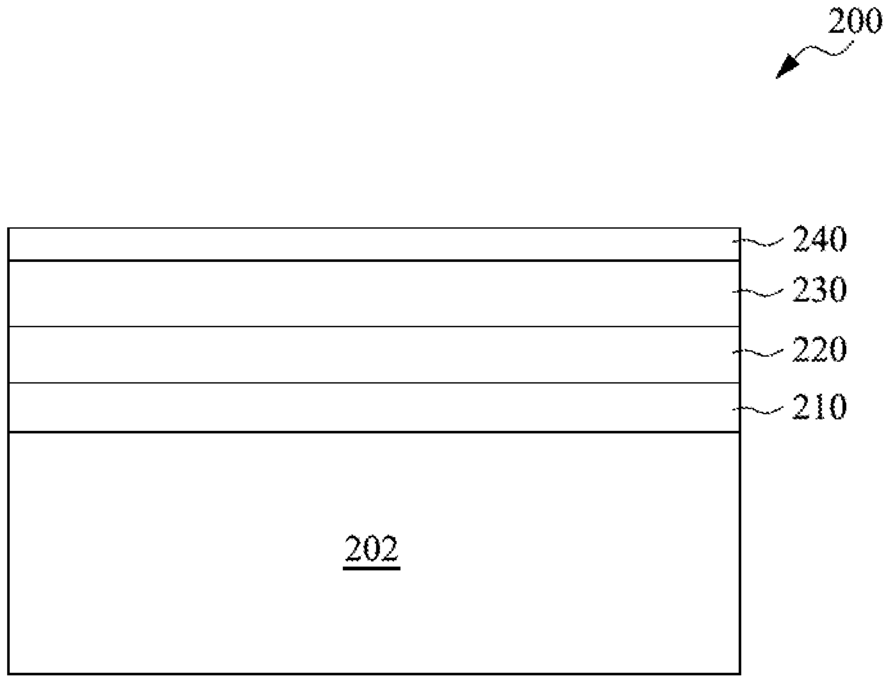

Referring to FIGS. 1 and 2D, the method 100 proceeds to operation 108, in which a top coating layer 240 is formed over the photoresist layer 230, in accordance with some embodiments. FIG. 2D is a cross-sectional view of the semiconductor structure 200 of FIG. 2C after forming the top coating layer 240 over the photoresist layer 230, in accordance with some embodiments. The top coating layer 240 can be a fourth layer in a patterning stack.

Referring to FIG. 2D, the top coating layer 240 is disposed over the photoresist layer 230. The top coating layer 240 includes a material having an etching resistance greater than that of the photoresist layer 230. In some embodiments, the etching resistance of the top coating layer 240 is at least about 15% higher than that of the photoresist layer 230. In other words, the etching rate of the top coating layer 240 is at least 15% less than that of the photoresist layer 230. In combination with the photoresist layer 230, the higher etching resistance of the top coating layer 240 allows control of the consumption rate of the top coating layer 240 and the photoresist layer 230 during the etching of the middle material layer 220 so as to provide sufficient etching budget. In addition to provide sufficient etching budget, introducing the top coating layer 240 allows using a thin photoresist layer for lithography patterning, which helps to prevent the photoresist pattern collapse.

In some embodiments, the top coating layer 240 includes a carbon-rich polymer or a silicon-rich material and one or more PACs.

In some embodiments, the top coating layer 240 includes a carbon-rich polymer having a carbon concentration of greater than 50% by weight. In some embodiments, the carbon-rich polymer has a carbon concentration of about 80%, about 82%, about 85%, about 90%, or about 92%. The carbon-rich polymer includes at least one functional unit capable of enhancing etching resistance to etch chemistry used to etch the underlying material layer (e.g., the middle material layer 220). In some embodiments, the functional unit may include a tertiary carbon, a double bond, a triple bond, an aromatic group, or combinations thereof.

In some embodiments, the carbon-rich polymer may also contains one or more acid labile groups attached to the polymer backbone which decompose when mixed with acids generated by the PAGs. In some embodiments, the acid labile group may be a carboxylic acid group, a fluorinated alcohol group, a phenolic alcohol group, a sulfonic group, a sulfonamide group, a sulfonylimido group, an (alkylsulfonyl)methylene group, an (alkylcarbonyl)methylene group, an (alkylsulfonyl)imido group, an (alkylcarbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl)imido group, a tris(alkylsulfonyl)methylene group, combinations of these, or the like. Specific groups that may be utilized for the carboxylic acid group include acrylic acid groups, methacrylic acid groups, or the like.

In some embodiments, the carbon-rich polymer has one of the following structures:

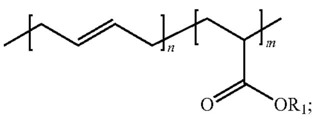

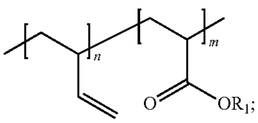

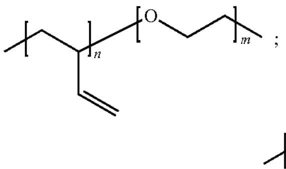

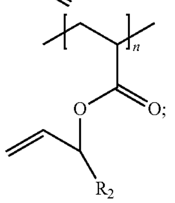

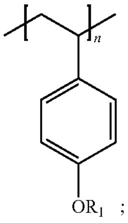

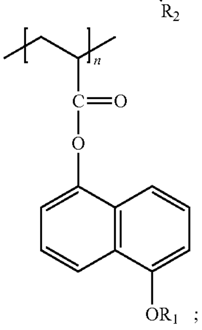

-continued

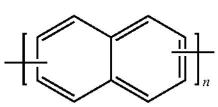

or

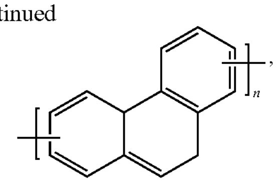

wherein:

$R_1$ is an acid labile group;

$R_2$ is substituted or unsubstituted aryl having 3 to 18 carbon atoms, substituted or unsubstituted cycloalkyl having 3 to 18 carbon atoms, or substituted or unsubstituted cyclic alkene having 3 to 18 carbon atoms; and m and n are independently an integer greater than 0.

In a further embodiments, the top coating layer 240 comprises a mixture of polymers having the above structures.

In some embodiments, the top coating layer 240 may include a silicon-rich material. In some embodiments, the top coating layer 240 includes a silicon-rich polymer such as, for example, a siloxane polymer (e.g., a polymer having a backbone of —O—Si—O—Si—). The silicon ratio of the top coating layer material may be controlled as to provide the higher etching resistance to the top coating layer 240.

In some embodiments, the top coating layer 240 includes silsesquioxane. For example, the top coating layer 240 may be a cage-type silsesquioxane having the following structure:

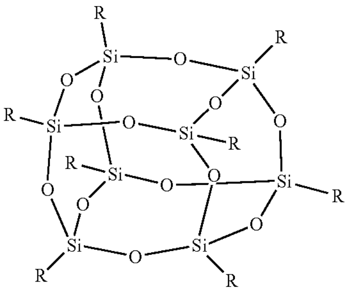

wherein R, at each occurrence, is independently hydrogen, a substituted or unsubstituted alkyl group having 1 to 8 carbon atoms, a substituted or unsubstituted cycloalkyl group having 3 to 18 carbon atoms, or a substituted or unsubstituted alkoxy group having 1 to 8 carbon atoms.

In some embodiments, the top coating layer 240 may also include a PAG the same as, or different from, the PAG in the photoresist layer 230. For examples, the PAGs may be salts of sulfonium cations with sulfonates, salts of iodonium cations with sulfonates, sulfonyldiazomethane compounds, N-sulfonyloxyimide PAGs, benzoinsulfonate PAGs, pyrogallol trisulfonate PAGs, nitrobenzyl sulfonate PAGs, sulfone PAGs, glyoxime derivatives, and triphenylsulfonium nonaflate. The PAG may have a concentration ranging from about 1% to 30% by weight of the top coating layer 240.

In some embodiments, the top coating layer 240 further includes one or more additives such as, for example, surfactants, quenchers, stabilizers, dissolution inhibitors, plasticizers, coloring agents, adhesion additives, surface leveling agents, combinations thereof, or the like. Examples of various additives are described above with respect to the photoresist layer 230 and will not described in details herein.

In some embodiments, the top coating layer 240 may be deposited, for example, by spin coating. The spin coating process may be implemented by applying a top coating solution comprising the carbon-rich or silicon-rich material, the PAG and suitable additives and a solvent onto the top surface of the photoresist layer 230 followed by or simultaneously with rotating the substrate 202 to cause the top coating components to disperse across the top surface of the photoresist layer 230. The solvent is selected to not dissolve the underlying photoresist layer 230. In some embodiments, the solvent is an ether-type solvent such as, for example, methyl acetate, ethyl acetate, isopropyl acetate, n-butyl acetate, ethyl propionate, n-ethyl butyrate, and ethylene glycol diacetate, ethylene glycol monomethyl ether acetate, ethylene glycol monoethyl ether acetate, ethylene glycol mono-n-butyl ether (butyl cellosolve), or propylene glycol monomethyl ether acetate. In some embodiments, the top coating layer 240 is formed to have a thickness ranging from about 5 nm to about 10 nm. If the thickness of the top coating layer 240 is too small, the top coating layer 240 is not able to provide sufficient etching resistance to allow the complete transfer of the photoresist pattern into the middle material layer 220, in some instances. On the other hand, if the thickness of the top coating layer 240 is too great, production costs are increased as a result of unnecessary consumption of material and increased processing time to pattern the top coating layer 240, in some instances.

Subsequently, the solvent in the spun film is evaporated by baking (i.e., curing) the top coating layer 240. In some embodiments, the baking process may be conducted at a temperature ranging from about 120° C. to about 350° C. Other baking temperatures may also be suitable for evaporating the solvent.

Figure 2E:
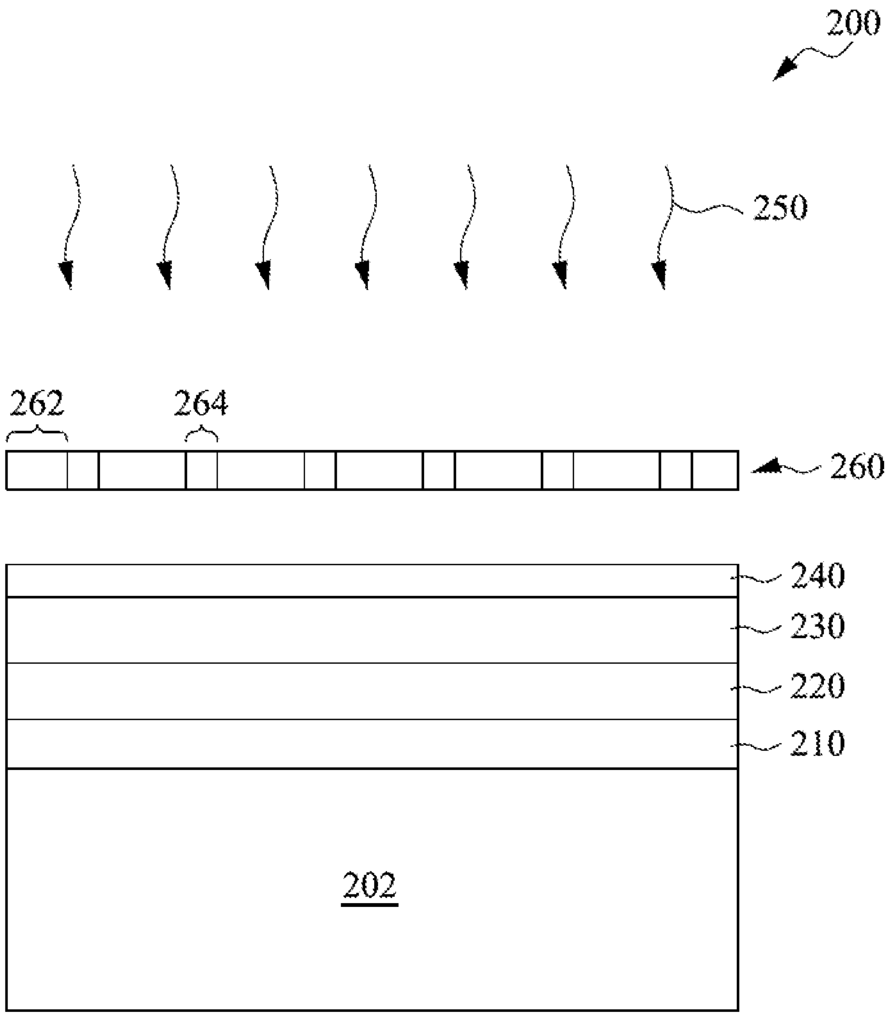

Referring to FIGS. 1 and 2E, the method 100 proceeds to operation 110, in which the top coating layer 240 and the photoresist layer 230 are exposed to patterning radiation 250, in accordance with some embodiments. FIG. 2E is a cross-sectional view of the semiconductor structure 200 of FIG. 2D after exposing the top coating layer 240 and the photoresist layer 230 to the patterning radiation 250, in accordance with some embodiments.

In some embodiments, the top coating layer 240 and the photoresist layer 230 are exposed to the patterning radiation 250 from a light source through a photomask 260. The photomask 260 has a predefined pattern designed for an IC, based on a specification of the IC to be manufactured. The patterns of the photomask 260 correspond to patterns of materials that make up the various components of the IC device to be fabricated. For example, a portion of the IC design layout includes various IC features, such as an active region, gate electrode, source and drain, metal lines or vias of an interlayer interconnection, and openings for bonding pads, to be formed in the substrate 202 and/or various material layers disposed on the substrate 202.

The photomask 260 includes first regions 262 and second regions 264. In the first regions 262, the patterning radiation 250 is blocked by the photomask 260 to reach the top coating layer 240 and the photoresist layer 230, while in the second regions 264, the patterning radiation 250 is not blocked by the photomask 260 and can pass through the photomask 260 to reach the top coating layer 240 and the photoresist layer 230. As a result, portions of the top coating layer 240 and the photoresist layer 230 below the second regions 264 receive the patterning radiation 250, referred to as exposed portions. While portions of the top coating layer

240 and the photoresist layer 230 below the first regions 262 do not receive the patterning radiation 250, referred to as unexposed portions.

In some embodiments, the patterning radiation 250 is a deep ultraviolet (DUV) radiation such as KrF excimer laser (248 nm) or ArF excimer laser (193 nm), an EUV radiation (13.5 nm), an e-beam radiation, an x-ray radiation, an ion beam radiation, or other suitable radiations. In some embodiments, the top coating layer 240 and the photoresist layer 230 are exposed to an EUV radiation beam with exposure energy from about 10 $mJ/cm^2$ to about 60 $mJ/cm^2$. If the exposure energy is too high, the efficiency of patterning does not change but production cost increases, in some instances. If the exposure energy is too low, the efficiency of patterning is too low, in some instances. In some embodiments, operation 110 is performed in a liquid (immersion lithography) or in a vacuum for EUV lithography and e-beam lithography.

Subsequently, the top coating layer 240 and the photoresist layer 230 may be subjected to a post-exposure bake process. The post-exposure bake process may be performed at a temperature from about 50° C. to about 150° C. for a duration from about 60 seconds to about 360 seconds.

Figure 2F:
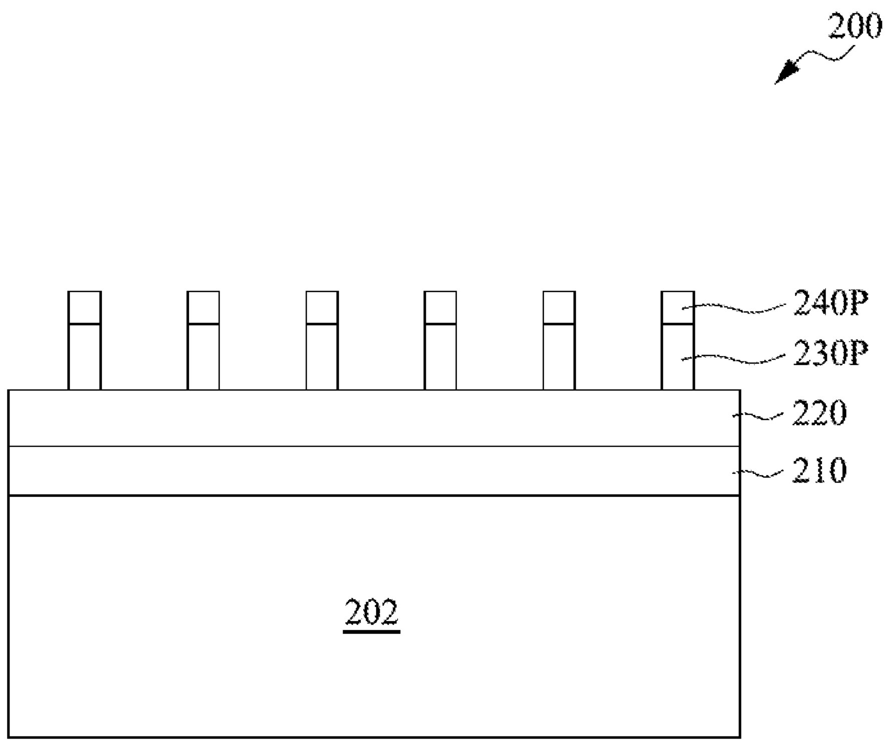

Referring to FIGS. 1 and 2F, the method 100 proceeds to operation 112, in which the top coating layer 240 and the photoresist layer 230 are developed using a developer to form a patterned top coating layer 240P and a patterned photoresist layer 230P, in accordance with some embodiments. FIG. 2F is a cross-sectional view of the semiconductor structure 200 of FIG. 2E after forming the patterned top coating layer 240P and the patterned photoresist layer 230P, in accordance with some embodiments.

Referring to FIG. 2F, during the developing process, the developer is applied to the top coating layer 240 and the photoresist layer 230. The developer may remove the exposed or unexposed portions of the top coating layer 240 and the photoresist layer 230 depending on the resist type. For example, and as shown in FIG. 2F, the top coating layer 240 and the photoresist layer 230 each comprise a negative tone resist, so the portions of the top coating layer 240 and the photoresist layer 230 that are exposed by the patterning radiation 250 are not dissolved by the developer and remain over the middle material layer 220. On the other hand, if the top coating layer 240 and the photoresist layer 230 each comprise a positive tone resist, the portions of the top coating layer 240 and the photoresist layer 230 that are exposed by the patterning radiation 250 would be dissolved by the developer, leaving the unexposed portions over the middle material layer 220.

The remaining portions define a pattern in the patterned top coating layer 240P and the patterned photoresist layer 230P. The pattern contains one or more openings where portions of the underlying middle material layer 220 are exposed.

The developer may include alcohols, aromatic hydrocarbons, and the like. Examples of alcohols include, but are not limited to, methanol, ethanol, 1-butanol, and 4-Methyl-2-pentanol. Examples of aromatic hydrocarbons include, but are not limited to, xylene, toluene and benzene. In some embodiments, the developer is selected from at least one of methanol, 4-Methyl-2-pentanol and xylene.

The developer may be applied using any suitable methods. In some embodiments, the developer is applied by dipping the structure into a developer bath. In some embodiments, the developing solution is sprayed onto the top coating layer 240 and the photoresist layer 230.

Figure 2G:
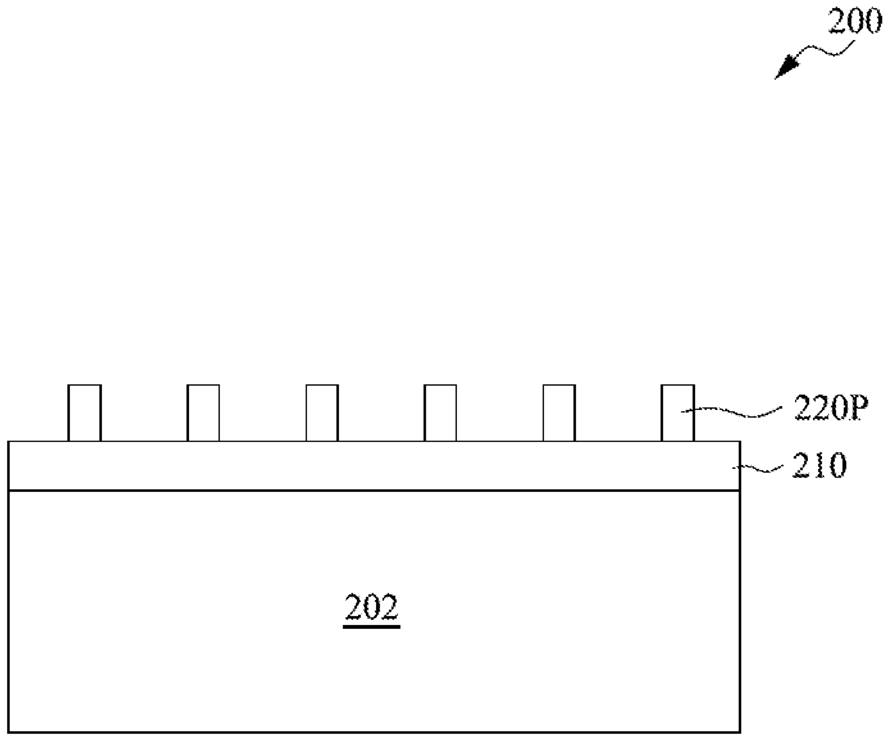

Referring to FIGS. 1 and 2G, the method 100 proceeds to operation 114, in which the middle material layer 220 is etched using the patterned top coating layer 240P and the patterned photoresist layer 230P as an etch mask, in accordance with some embodiments. FIG. 2G is a cross-sectional view of the semiconductor structure 200 of FIG. 2F after etching the middle material layer 220 using the patterned top coating layer 240P and the patterned photoresist layer 230P as an etch mask, in accordance with some embodiments.

Referring to FIG. 2G, the middle material layer 220 is patterned, using the patterned top coating layer 240P and the patterned photoresist layer 230P as an etch mask, to form a patterned middle material layer 220P.

An etching process may be performed to transfer the pattern in the patterned top coating layer 240P and the patterned photoresist layer 230P to the middle material layer 220. In some embodiments, the etching process employed is an anisotropic etch such as a dry etch although any suitable etch process may be utilized. In some embodiments, the dry etch is a reactive ion etch (RIE) or a plasma etch. In some embodiments, the dry etch is implemented by fluorine-containing gas (e.g., $CF_4$, $SF_6$, $CH_2F_2$, $CHF_3$, and/or $C_2F_6$), chlorine-containing gas (e.g., $Cl_2$. $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. In some embodiments, an oxygen plasma is performed to etch the middle material layer 220. In some embodiments, the anisotropic etch is performed at a temperature from about 250° C. to 450° C. for a duration from about 20 seconds to about 300 seconds.

If not completely consumed in the etching process, after formation of the patterned middle material layer 220P, the patterned photoresist layer 230P is removed, for example, by plasma ashing or wet stripping.

In the present disclosure, the top coating layer 240 and the photoresist layer 230 together act as an etch mask to etch the middle material layer 220. Since the top coating layer 240 has a higher etching resistance than the photoresist layer, if the etching time on the middle material layer 220 is assumed to be the same, the thickness of the photoresist layer 230 can be formed smaller than the case where only the photoresist layer 230 is used as the etch mask. As a result, the pattern collapse due to using a thick photoresist layer is prevented, while at the same time the complete transfer of the photoresist pattern into the middle material layer 220 is ensured. Consequently, the photoresist pattern can be transferred in the middle material layer 220 at a high precision.

Figure 2H:
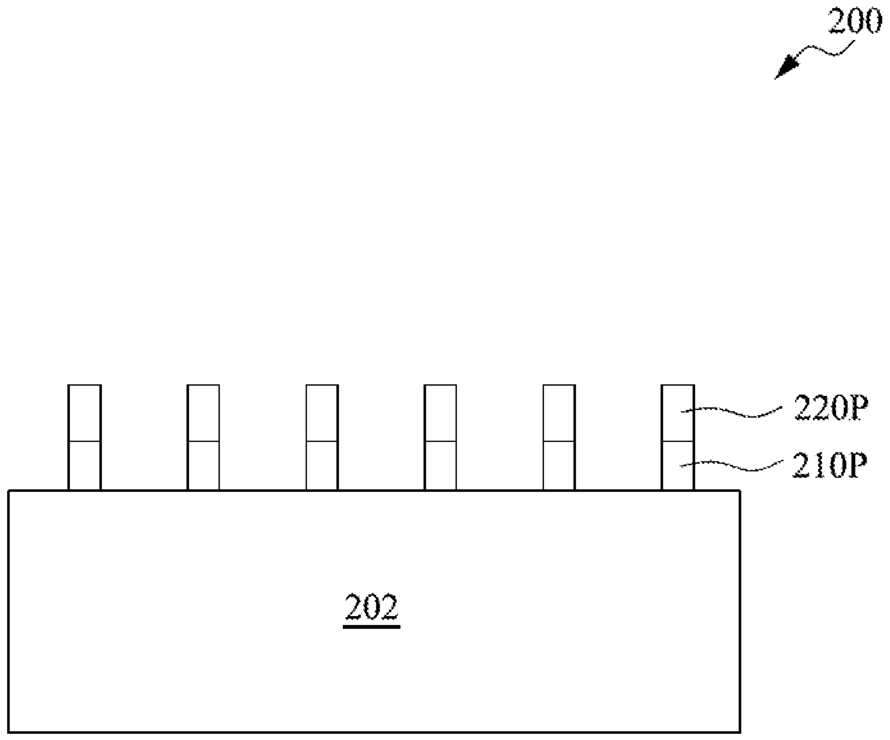

Referring to FIGS. 1 and 2H, the method 100 proceeds to operation 116, in which the bottom material layer 210 is etched using the patterned middle material layer 220P as an etch mask, in accordance with some embodiments. FIG. 2H is a cross-sectional view of the semiconductor structure 200 of FIG. 2G after etching the bottom material layer 210 using the patterned middle material layer 220P as an etch mask, in accordance with some embodiments.

Referring to FIG. 2H, the bottom material layer 210 is etched, using the patterned middle material layer 220P as an etch mask, to form a patterned bottom material layer 210P. Etching of the bottom material layer 210 exposes portions of the underlying substrate 202

An etching process may be performed to transfer the pattern in the patterned middle material layer 220P to the bottom material layer 210. In some embodiments, the etching process is an anisotropic etch such as a dry etch. In some embodiments, the dry etch is a RIE or a plasma etch.

Figure 2I:
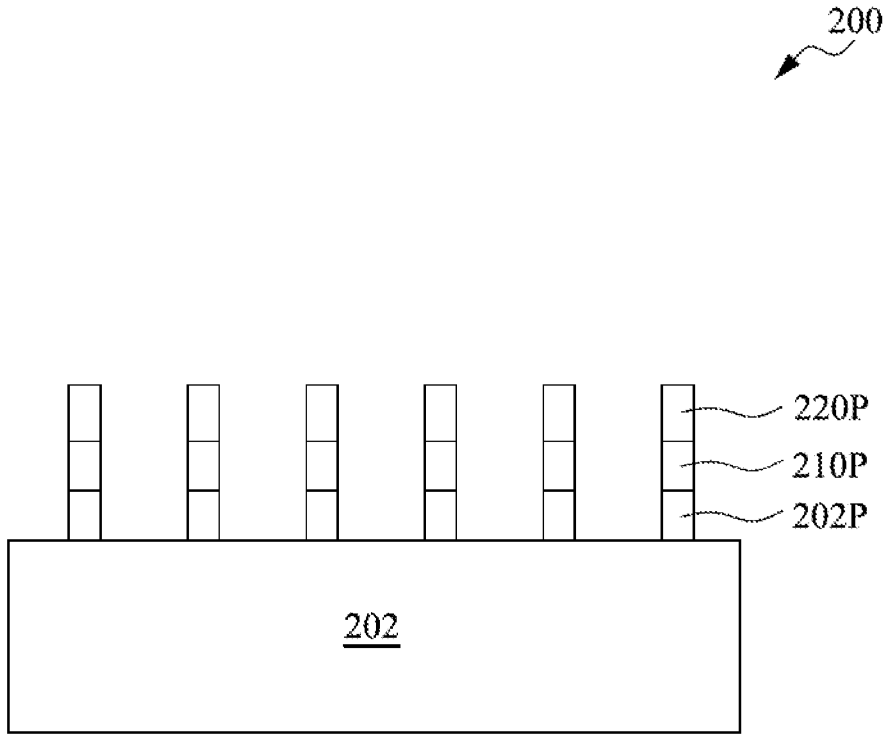

Referring to FIGS. 1 and 2I, the method 100 proceeds to operation 118, in which an upper portion of the substrate 202 is etched using the patterned middle material layer 220P and the patterned bottom material layer 210P as an etch mask, in accordance with some embodiments. FIG. 2I is a cross-sectional view of the semiconductor structure 200 of FIG. 2H after etching the upper portion of the substrate 202 using the patterned middle material layer 220P and the patterned bottom material layer 210P as an etch mask, in accordance with some embodiments.

Referring to FIG. 2I, the substrate 202 is etched, using the patterned middle material layer 220P and the patterned bottom material layer 210P as an etch mask, to form patterned features 202P in the substrate 202. The patterned features 202P may be gate structures, fin structures such as provided in a fin-type field effect transistor, interconnect structures, isolation features, conductive features such as lines, and/or other suitable semiconductor device features.

An etching process may be performed to remove portions of the substrate 202 that are exposed by the patterned middle material layer 220P and the patterned bottom material layer 210P. In some embodiments, the etching process is an anisotropic etch such as a dry etch. In some embodiments, the dry etch is a RIE or a plasma etch.

One aspect of this description relates to a patterning stack. The patterning stack includes a bottom anti-reflective coating (BARC) layer over a substrate, a photoresist layer having a first etching resistance over the BARC layer, and a top coating layer having a second etching resistance greater than the first etching resistance over the photoresist layer. The top coating layer includes a polymer having a polymer backbone including at least one functional unit of high etching resistance and one or more acid labile groups attached to the polymer backbone or a silicon cage compound.

Another aspect of this description relates to a patterning stack. The patterning stack includes a first material layer over a substrate, a second material layer over the first material layer, a photoresist layer having a first etching resistance over the second material layer, and a top coating layer having a second etching resistance greater than the first etching resistance over the photoresist layer. The top coating layer comprises a polymer, a photo acid generator and a quencher, the polymer having one of the following structures:

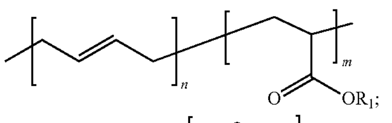

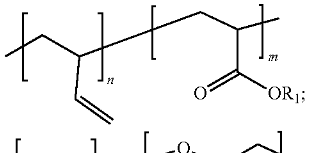

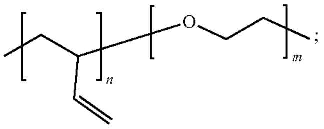

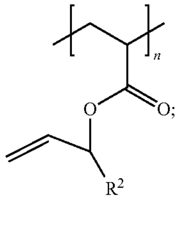

-continued

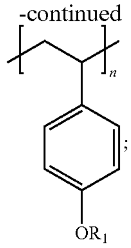

;

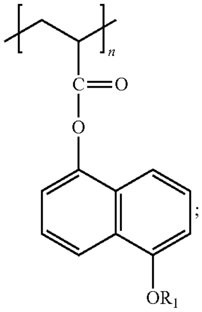

;

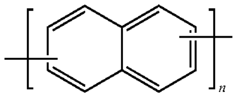

or

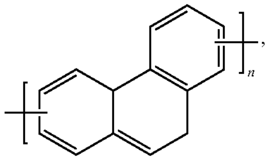

, wherein:

$R_1$ is an acid labile group;

$R_2$ is substituted or unsubstituted aryl, substituted or unsubstituted cycloalkyl, or substituted or unsubstituted cyclic alkene; and m and n are independently an integer greater than 0.

Still another aspect of this description relates to a method for forming a semiconductor structure. The method includes depositing a first material layer over a substrate, depositing a second material layer over the first material layer, forming a photoresist layer having a first etching resistance over the second material layer, forming a top coating layer having a second etching resistance greater than the first etching resistance over the photoresist layer, patterning the top coating layer and the photoresist layer to provide a patterned top coating layer and a patterned photoresist layer, and etching the second material layer using the patterned top coating layer and the patterned photoresist layer as an etch mask to provide a patterned second material layer. The top coating layer includes a polymer having a polymer backbone containing at least one functional unit of high etching resistance and one or more acid labile groups attached to the polymer backbone or a silicon cage compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor structure, comprising:

depositing a first material layer over a substrate;

depositing a second material layer over the first material layer;

forming a photoresist layer having a first etching resistance over the second material layer, the photoresist layer comprising a polymer and one or more photoactive compounds; and forming a top coating layer having a second etching resistance greater than the first etching resistance over the photoresist layer, wherein the top coating layer comprises a silicon cage compound consisting of the following structure:

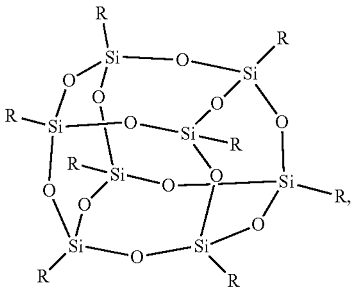

, wherein R, at each occurrence, is independently unsubstituted alkyl, unsubstituted cycloalkyl or unsubstituted alkoxy;

exposing the top coating layer and the photoresist layer to a patterning radiation;

developing the top coating layer and the photoresist layer to provide a patterned top coating layer and a patterned photoresist layer at the same time; and etching the second material layer using the patterned top coating layer and the patterned photoresist layer as an etch mask to provide a patterned second material layer.

2. The method of claim 1, wherein exposing the top coating layer and the photoresist layer to the patterning radiation comprises exposing the top coating layer and the photoresist layer to a deep ultraviolet (DUV) radiation, an extreme ultraviolet EUV) radiation, an e-beam radiation, an x-ray radiation or an ion beam radiation.

3. The method of claim 2, wherein the patterning radiation is an EUV radiation with exposure energy from about 10 $mJ/cm^2$ to about 60 $mJ/cm^2$.

4. The method of claim 1, wherein forming the top coating layer comprises applying a top coating solution comprising the silicon cage compound and a solvent onto a top surface of the photoresist layer.

5. The method of claim 2, further comprising curing the top coating layer at a temperature ranging from 120° C. to 350° C.

6. A method for fabricating a semiconductor structure, comprising:

depositing a bottom anti-reflective coating (BARC) layer over a substrate;

applying a photoresist layer having a first etching resistance over the BARC layer, the photoresist layer including a negative tone photoresist; and forming a top coating layer having a second etching resistance greater than the first etching resistance over the photoresist layer, wherein the top coating layer comprises a silicon cage compound consisting of the following structure:

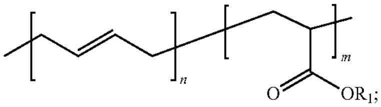
;
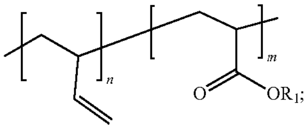
;
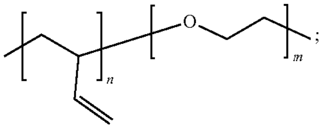
;
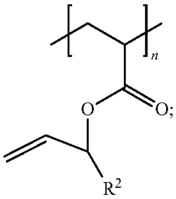
;
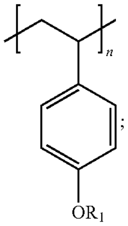
;
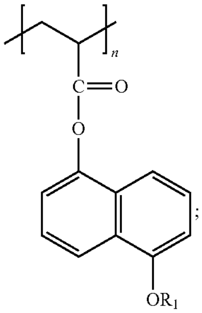
;
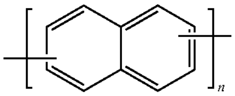
or
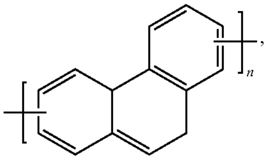
, wherein R, at each occurrence, is independently unsubstituted alkyl, unsubstituted cycloalkyl or unsubstituted alkoxy;

patterning the top coating layer and the photoresist layer to provide a patterned top coating layer and a patterned photoresist layer, wherein patterning the top coating layer and the photoresist layer comprises:

exposing the top coating layer and the photoresist layer to radiation; and developing the exposed top coating layer and the photoresist layer by a developer;

etching the BARC layer by an etching gas using the patterned top coating layer and the patterned photoresist layer as an etch mask to provide a patterned BARC layer; and removing portions of the substrate not covered by the patterned BARC layer.

7. The method of claim 6, wherein the photoresist layer comprises a t-butyloxycarbonyl (t-BOC) or acetal resist.

8. The method of claim 7, wherein the photoresist layer further comprises a photo acid generator.

9. The method of claim 6, wherein the BARC layer comprises silicon oxide or silicon oxygen carbide.

10. The method of claim 6, wherein the BARC layer is in direct contact with the photoresist layer and comprises a polymer, the polymer having a polymer backbone and a plurality of pendant groups covalently bonded to the polymer backbone, the polymer backbone comprising a backbone of poly (hydroxystyrene) or poly (methyl methacrylate), and the plurality of pendant groups comprising one or more cross-linking agent groups, one or more chromophores and one or more polar groups.

11. The method of claim 6, further comprising forming a planarization layer between the BARC layer and the substrate, and etching the planarization layer using the patterned BARC layer as an etch mask.

12. The method of claim 11, wherein forming the planarization layer comprises depositing a spin-on carbon, diamond-like carbon, polyarylene ether or polyimide over the substrate by spin coating prior to depositing the BARC layer.

13. The method of claim 6, wherein the photoresist layer has a thickness ranging from 50 nm to 80 nm, and the top coating layer has a thickness ranging from about 5 nm to about 10 nm.

14. A method comprising:

applying a bottom anti-reflective coating (BARC) layer on a substrate;

forming a photoresist layer over the bottom anti-reflective coating (BARC) layer, the photoresist layer having a first etching resistance and a first thickness;

forming a top coating layer over the photoresist layer, the top coating layer having a second etching resistance greater than the first etching resistance and a second thickness less than the first thickness, wherein the top coating layer is a silicon-rich layer comprising a silicon cage compound consisting of the following structure:

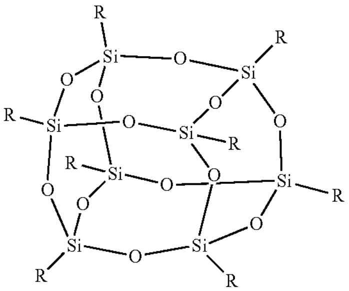

wherein R, at each occurrence, is independently unsubstituted alkyl, unsubstituted cycloalkyl or unsubstituted alkoxy;

exposing the photoresist layer and the top coating layer to radiation;

developing the exposed top coating layer and the photoresist layer by a developer to form a patterning mask comprising a patterned top coating layer and a patterned photoresist layer; and etching the bottom anti-reflective coating (BARC) using an etching gas to remove portions of the bottom anti-reflective coating (BARC) layer that are not covered by the patterning mask.

15. The method of claim 14, wherein the second etching resistance is at least 15% greater than the first etching resistance.

16. The method of claim 14, wherein the photoresist layer has a thickness ranging from 50 nm to 80 nm, and the top coating layer has a thickness ranging from 5 nm to 10 nm.

17. The method of claim 14, wherein the top coating layer and the photoresist layer are exposed to an EUV radiation beam with exposure energy from about 10 $mJ/cm^2$ to about 60 $mJ/cm^2$.

18. The method of claim 1, further comprising:

etching the first material layer using the patterned second material layer as an etch mask to provide a patterned first material layer; and etching an upper portion of the substrate using the patterned second material layer and the patterned first material layer as an etch mask.

19. The method of claim 6, wherein the etching gas comprises $CF_4$, $SF_6$, $CH_2F_2$, $CHF_3$, $C_2F_6$ or combinations thereof.

20. The method of claim 14, wherein the etching gas comprises a fluorine-containing gas, a chlorine-containing gas, an oxygen-containing gas, an iodine-containing gas or combinations thereof.

* * * * *